(12) United States Patent
DCamp et al.

(10) Patent No.: US 6,927,098 B2
(45) Date of Patent: Aug. 9, 2005

(54) METHODS AND APPARATUS FOR ATTACHING MEMS DEVICES TO HOUSING

(75) Inventors: Jon B. DCamp, Savage, MN (US); Harlan L. Curtis, Champlin, MN (US); Lori A. Dunaway, New Hope, MN (US); Max C. Glenn, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/431,420

(22) Filed: May 7, 2003

(65) Prior Publication Data

US 2004/0223373 A1 Nov. 11, 2004

(51) Int. Cl.[7] .............................................. H01L 21/44
(52) U.S. Cl. .................... 438/121; 438/106; 438/107; 438/108; 438/125
(58) Field of Search ................................ 438/106, 107, 438/108, 121, 125

(56) References Cited

U.S. PATENT DOCUMENTS

| | | | | |
|---|---|---|---|---|
| 4,933,808 A | * | 6/1990 | Horton et al. | 361/715 |
| 5,109,320 A | * | 4/1992 | Bourdelaise et al. | 361/785 |
| 5,627,406 A | * | 5/1997 | Pace | 257/700 |
| 5,904,499 A | * | 5/1999 | Pace | 438/108 |
| 6,316,840 B1 | | 11/2001 | Otani | |
| 6,388,203 B1 | | 5/2002 | Rinne et al. | |
| 6,459,150 B1 | | 10/2002 | Wu et al. | |
| 6,500,760 B1 | | 12/2002 | Peterson et al. | |
| 6,519,075 B2 | | 2/2003 | Carr et al. | |
| 6,536,653 B2 | | 3/2003 | Wang et al. | |
| 6,550,337 B1 | | 4/2003 | Wagner et al. | |
| 6,613,605 B2 | * | 9/2003 | Pace | 438/106 |
| 6,639,313 B1 | * | 10/2003 | Martin et al. | 257/704 |
| 6,768,207 B2 | * | 7/2004 | Tao et al. | 257/777 |
| 2002/0185715 A1 | | 12/2002 | Honer et al. | |
| 2003/0095343 A1 | | 5/2003 | Feldman | |
| 2003/0122243 A1 | | 7/2003 | Lee et al. | |
| 2003/0122244 A1 | | 7/2003 | Lin et al. | |
| 2003/0122246 A1 | | 7/2003 | Lin et al. | |
| 2003/0124767 A1 | | 7/2003 | Lee et al. | |
| 2003/0124835 A1 | | 7/2003 | Lin et al. | |

FOREIGN PATENT DOCUMENTS

| | | |
|---|---|---|
| EP | 1 157 967 A | 11/2001 |
| JP | 2001004473 | 1/2001 |
| WO | WO 01/50106 A | 7/2001 |
| WO | WO 02/064497 A * | 8/2002 |

OTHER PUBLICATIONS

International Search Report dated Sep. 15, 2004, Application No. PCT/US2004/014268, 15 pages.

* cited by examiner

*Primary Examiner*—Andy Huynh
(74) *Attorney, Agent, or Firm*—Matthew Luxton, Esq.; Armstrong Teasdale LLP

(57) ABSTRACT

A method for increasing the bonding strength between a die and a housing for the die is described where a microelectromechanical system (MEMS) device is formed on the die. The method comprises depositing a plurality of clusters of contact material onto a bottom surface of the housing, placing the die onto the clusters, and subjecting the housing, the clustered contacts, and the die to a thermocompression bonding process.

20 Claims, 4 Drawing Sheets

METHODS AND APPARATUS FOR ATTACHING MEMS DEVICES TO HOUSING

BACKGROUND OF THE INVENTION

This invention relates generally to manufacturing of Micro Electromechanical System (MEMS) devices, and more specifically, to attaching dies of MEMS devices to chip carriers.

Micro-electromechanical systems (MEMS) include electrical and mechanical components integrated on the same substrate, for example, a silicon substrate. Substrates for MEMS devices are sometimes referred to as dies. The electrical components are fabricated using integrated circuit processes, while the mechanical components are fabricated using micromachining processes that are compatible with the integrated circuit processes. This combination makes it possible to fabricate an entire system that fits within a chip carrier using standard manufacturing processes.

One common application of MEMS devices is utilization within inertial sensor. The mechanical portion of the MEMS device provides the sensing capability for the inertial sensor, while the electrical portion of the MEMS device processes the information received from the mechanical portion. Examples of inertial sensors that utilize MEMS devices include gyroscopes and accelerometers.

The MEMS production process involves the placement of the operational portion of the MEMS device, sometimes referred to as a micro-machine, within a chip carrier or housing, which is then hermetically sealed. In one known placement process, the die or substrate on which the operational portion of the MEMS device is formed is attached to gold contacts in the carrier using a thermocompression bonding process. However, this thermocompression process involves use of forces that sometimes result in damage to the die, e.g., cracks in the die. The cracks in the die can result in reduced strength in the bond between the chip carrier and the die. Since MEMS devices are often utilized in high gravitational force (high-G) environments, the bond strength between the chip carrier and the die is important. Should the chip carrier and the die become separated, operation of the MEMS device could be compromised.

BRIEF SUMMARY OF THE INVENTION

In one aspect, a method for bonding a die and a housing for the die is provided. A micro-electromechanical system (MEMS) device is formed on the die and the method comprises depositing a plurality of clusters of contact material onto a bottom surface of the housing, placing the die onto the clusters, and subjecting the housing, the clustered contacts, and the die to a thermocompression bonding process.

In another aspect, a micro-electromechanical system (MEMS) device is provided which comprises a micromachine formed on a die, a housing having a bottom surface configured to hold the micro-machine, and a plurality of contact clusters on the bottom surface of the housing. Each cluster includes a plurality of individual contacts which is utilized to bond the die to the housing through a thermocompression process.

In still another aspect, a micro-electromechanical system (MEMS) gyroscope is provided. The MEMS gyroscope comprises a housing, a die, and a micro-machine formed on the die which includes at least one sense plate, at least one proof mass suspended above the at least one sense plate, at least one motor drive combs and at least one motor pick-off comb. The gyroscope further comprises a plurality of contact clusters between the die and the housing, each cluster comprising a plurality of individual contacts utilized to bond the die to the housing through a thermocompression process.

In yet another aspect, a method for forming a thermocompression bond between a die and a housing is provided. The die has a micro-electromechanical system (MEMS) machine formed thereon and the method comprises depositing a plurality of clusters of contact material between the die and the housing and forming the bond between the die and the housing.

DETAILED DESCRIPTION OF THE INVENTION

Figure 1:
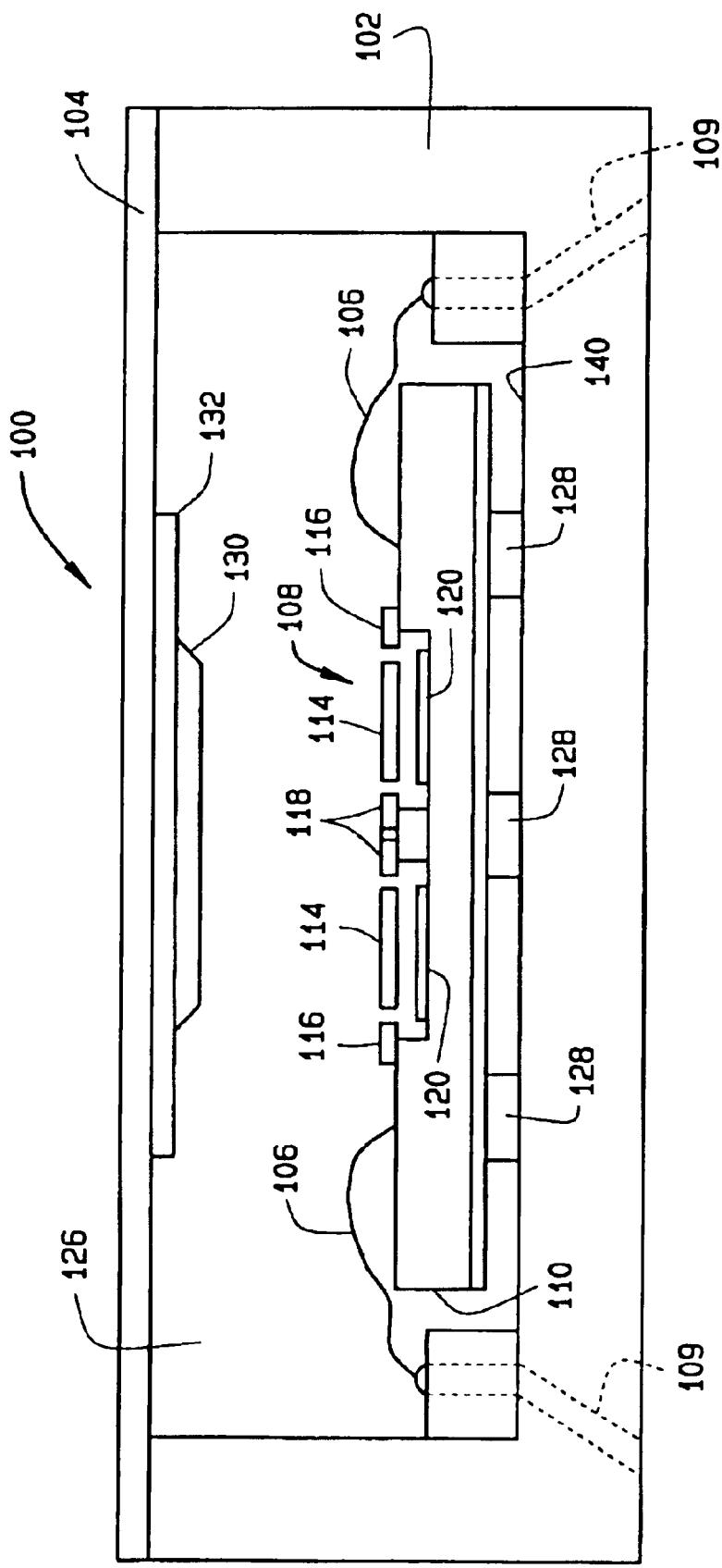
FIG. 1 is a side view of a known MEMS device.

FIG. 1 is a diagram of one known embodiment of a Micro-Electromechanical System (MEMS) 100. MEMS 100 includes a housing 102 (sometimes referred to as a chip carrier) to which a cover 104 is eventually attached in order to form a sealed cavity. Electrical leads 106 provide electrical connections to a micro-machine 108 which includes a die 110 that is attached to housing 102. As shown in FIG. 1, electrical connections 109 are provided through housing 102 to external devices (not shown). For example, in the case of a MEMS tuning fork gyroscope, micro-machine 108 includes proof masses 114, motor drive combs 116, and motor pick-off combs 118. Micro-machine 108 further includes sense plates 120 which form parallel plate capacitors with proof masses 114. In one embodiment, sense plates 120 are metal films that have been deposited and patterned onto die 110.

Upon completion of the micro-machine portion of MEMS device 100, cover 104 is attached to housing 102, forming a substantial hermetic seal. In one embodiment, a cavity 126 is formed when cover 104 is attached to housing 102. Cavity 126 is first evacuated to remove any gases (i.e. oxygen, hydrogen, water vapor) within cavity 126. Cavity is then backfilled with a dry gas to a controlled pressure. Typically the dry gas is an inert gas, for example, nitrogen or argon. In another embodiment, cover 104 is attached to housing 102 under vacuum conditions, resulting in vacuum conditions within cavity 126. Cavity 126 provides an environment that allows components of micro-machine 108 to move freely. For example, proof masses 114 may be movably coupled to micro-machine chip 108 and therefore may oscillate within the vacuum of cavity 126. Before cover 104 is attached to housing 102, die 110 is mounted to housing 102 through a thermocompression bonding process utilizing a plurality of contacts 128. In one embodiment, contacts 128 are made from gold. Since the bonding process utilizes pressure, die 110 is sometimes prone to cracking. The cracking of die 110 could affect operation of MEMS device 100, especially in high-G environments.

Figure 2:
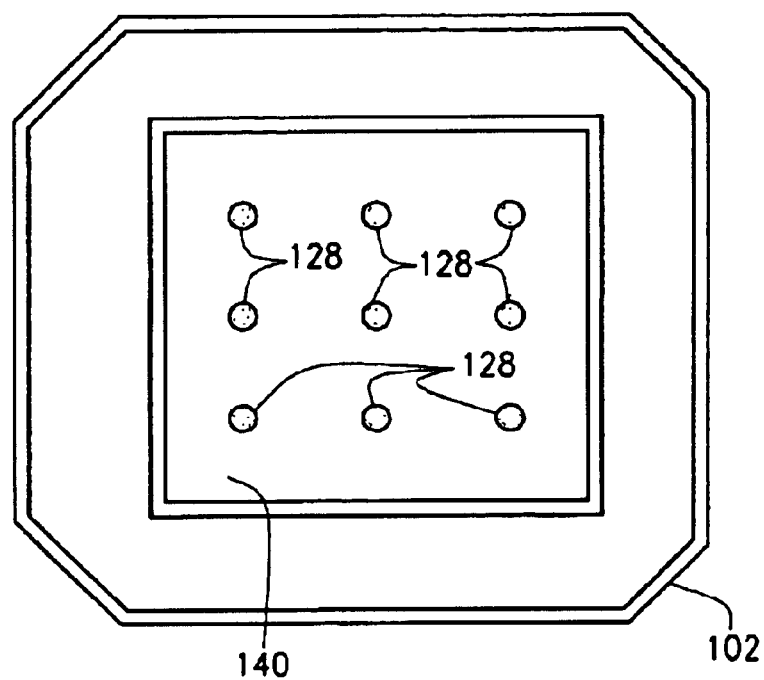
FIG. 2 is a top view of a known MEMS device housing showing contacts for a die.

FIG. 2 is a top view of housing 102 with die 110 and cover 104 removed, illustrating contacts 128 placed within a bottom surface 140 of housing 102 before die 110 is attached to housing 102 (contacts 128) with the thermocompression bonding process. In the embodiment shown, nine contacts 128 are deposited onto bottom surface 140. In one embodiment, before die 110 is attached with the thermocompression process, contacts have a diameter of about 5 mil.

Figure 3:
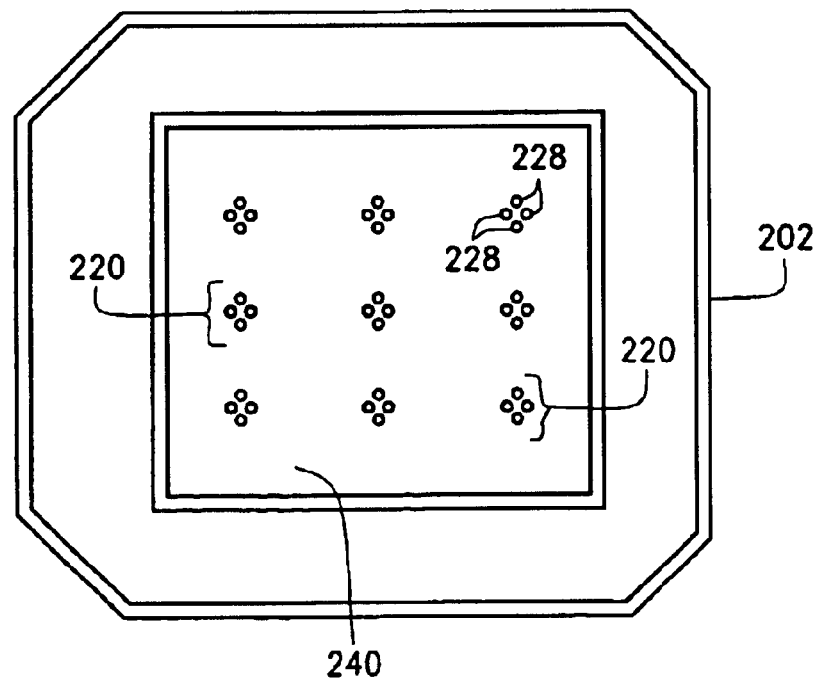
FIG. 3 is a top view of a MEMS device housing showing clustered contacts for attaching a die to the housing.

FIG. 3 is a top view of a housing 202, similar to housing 102 (shown in FIG. 2), except that housing 202 has clusters 220 of contacts 228 on a bottom surface 240 of housing 202. Housing 202 includes a same number (e.g. nine) of clusters 220 as housing 102 (shown in FIG. 2) has contacts 128 (shown in FIG. 2). Clusters 220 each include four contacts 228, although fewer or more contacts 228 can be incorporated into each cluster 220. In the embodiment shown, nine clusters 220 of contacts 228 are deposited onto bottom surface 140. By incorporating cluster 220 of contacts 228, a greater surface area of die 110 is in contact with contacts 228 than with contacts 128, which as described below, results in a stronger bond between die 110 and housing 202. In one embodiment, each contact 228 of cluster 220 has a diameter of about two mil.

Figure 4:
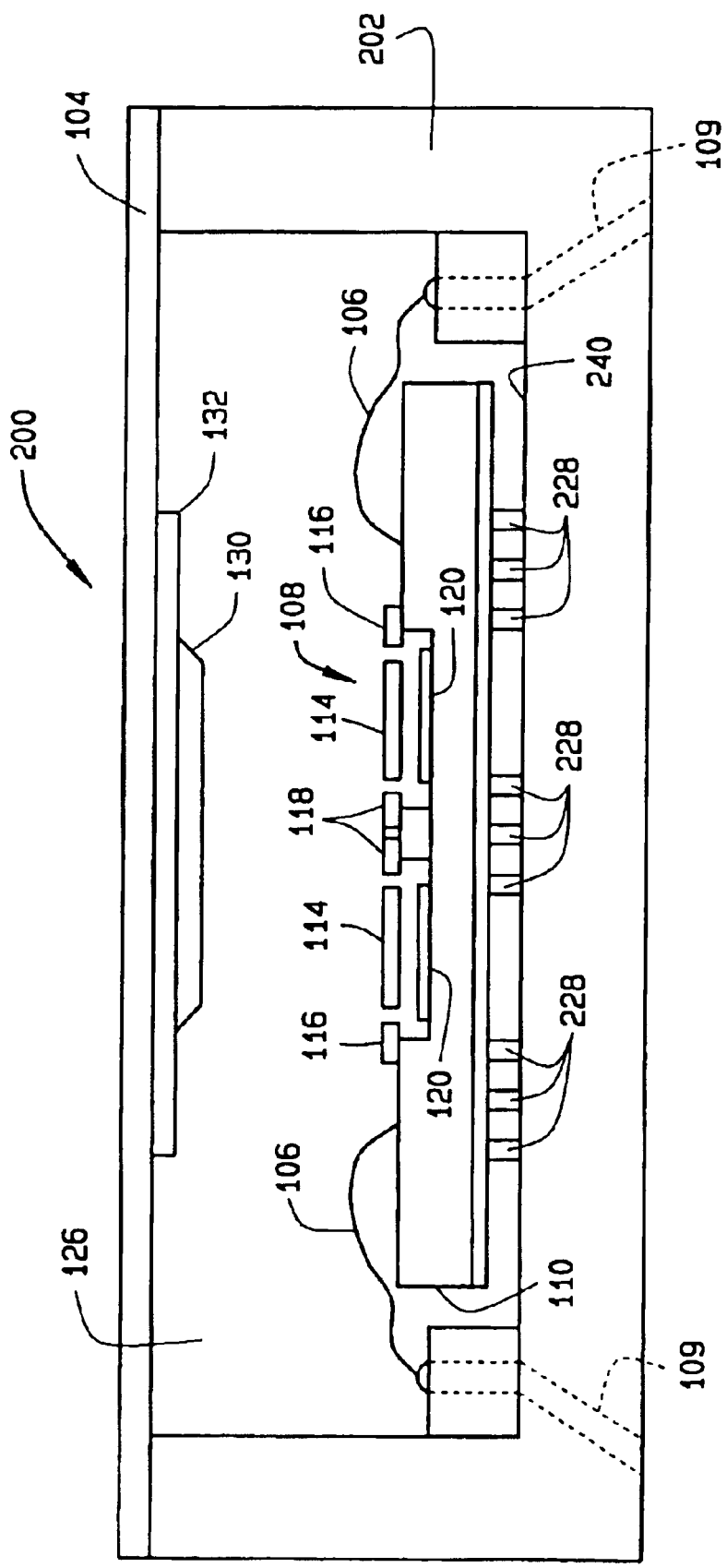
FIG. 4 is a side view of a MEMS device which utilizes clustered contacts.

FIG. 4 illustrates a side view of an embodiment of a MEMS device 200 which incorporates cluster contacts 228 as described with respect to FIG. 3. As compared to contacts 128, clusters of contacts 228 provide the attachment mechanism for forming thermocompression bonds with a die, while distributing the bond area over more of the die surface, which allows the die to better withstand the pressures utilized in thermocompression bonding as compared to known attachment methods. The higher pressures result in stronger thermocompression bonds with the die than the bonds that are formed in utilizing the known attachment methods (e.g. use of single contacts 128). The stronger bonds are sufficiently strong enough to allow operation of a MEMS device on a die that operates in a high-G environment. In addition, the larger surface area of contact also helps to prevent damage to the die. In one embodiment, individual contacts 228 within clusters 220 are about two mil in diameter before contact with a die, and before the thermocompression process.

MEMS devices 100 and 200 may comprise more or fewer components than described. For instance, while two electrical contacts 106 are illustrated, those skilled in the art will recognize that a MEMS device may comprise more than two contacts and/or extruding pins as well. Additionally, more or fewer members may be present in MEMS devices 100 and 200 other than those components above described. Further, components of MEMS devices 100 and 200 may comprise multiple functions. Micro-machine 110 may be any such electromechanical machine used in accordance with MEMS and MEMS based devices. In addition, alternate packages may be used as well to provide a housing for MEMS 100 and 200. The illustrations in the Figures are intended to show embodiments for attaching a MEMS device within a housing utilizing clustered contacts 228 rather than provide a description of a specific MEMS device.

Figure 5:
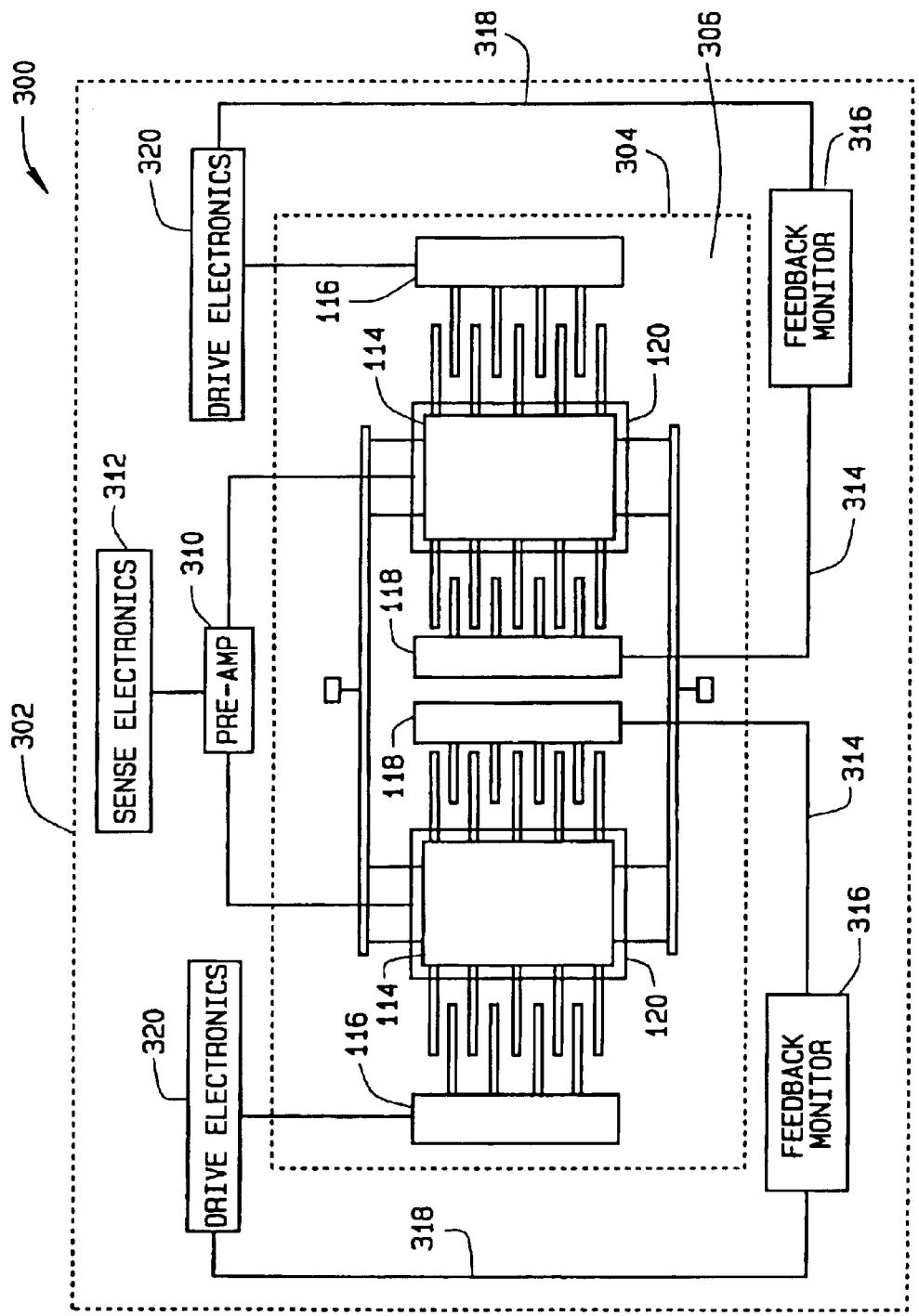
FIG. 5 is a schematic view of a MEMS gyroscope which can be produced utilizing the clustered contacts and housing of FIGS. 3 and 4.

FIG. 5 is a schematic illustration of MEMS gyroscope 300 configured to incorporate clustered contacts 228 (shown in FIGS. 3 and 4) to attach die 110 (shown in FIG. 4) to a housing through thermocompression bonding. In one embodiment, MEMS gyroscope 300 includes housing 302 that includes therein, for example, a tuning fork gyroscope (TFG) 304 on die 110 (shown in FIG. 4). Housing 302 is configured to be sealed with cover 104 (shown in FIG. 4). Housing 302 is typically one of a plastic package, a small outline integrated circuit (SOIC) package, a ceramic leadless chip carrier, a plastic leaded chip carrier (PLCC) package, a quad flat package (QFP), or other housings as known in the art. Housing 302 provides a structure to co-locate elements of TFG 304 and/or locate other elements within a close proximity of one another within the housing 302. TFG 304, in one embodiment, is located within a substantially sealed cavity 306 which is formed by bonding cover 104 to housing 302.

In one embodiment, TFG 304 includes proof masses 114, motor drive combs 116, motor pick-off combs 118, and sense plates 120 constructed from a wafer. A pre-amplifier 310 is included within housing 302 and is electrically connected or coupled to each proof mass 114 and sense plate 120 combination. In one embodiment, pre-amplifier 310 and TFG 304 are formed on a common substrate (e.g. die 110) and, in one embodiment, are electrically connected. In other embodiments, pre-amplifier 310 is electrically connected to proof masses 114. An output of pre-amplifier 310 is sent to sense electronics 312, or alternatively, pre-amplifier 310 is incorporated within sense electronics 312.

In addition, an output 314 of motor pick-off combs 118 is transferred to feedback monitors 316. Feedback monitors 316 provide output signals 318 to drive electronics 320, which power motor drive combs 116. Alternatively, feedback monitors 316 are incorporated within drive electronics 320. MEMS gyroscope 300 also includes a system power source and other operational electronics, which are not shown in FIG. 5 for ease of illustration.

Motor drive combs 116 excite the proof masses 114 using electrostatic forces by applying a voltage to electrodes of proof masses 114. Motor pick-off combs 118 monitor the excitation or oscillation of proof masses 114 by monitoring voltage signals on electrodes on proof masses 114. Motor pick-off combs 118 output a feedback signal to feedback monitors 316. Feedback monitor 316 provides an output 318 which is input to drive electronics 320. If proof masses 114 begin to oscillate too fast or too slow, drive electronics 320 may adjust an oscillation frequency such that proof masses 114 vibrate at a resonant frequency. Excitation at such a frequency may enable a higher amplitude output signal to be generated.

As above described, incorporation of clustered contacts 228 (shown in FIGS. 3 and 4) provide additional surface area and support when attaching a die, for example, die 110 (shown in FIG. 4) to housing 102 utilizing a thermocompression process. In certain embodiments, clustered contacts 228 provide two or more times as many contact points for attaching a die as compared to known attachment methods utilizing single contacts 128 (shown in FIGS. 1 and 2).

Utilization of clustered contacts 228, provides the advantages of thermocompression bonding techniques as known, while also providing a stronger bond between the dies and housings than is provided through utilization of single contacts. Clustered contacts are further usable in other sensor based-devices, including sensor devices where the micro-machine is oriented within a housing with an orientation that is upside down as compared as compared to known mounting orientations. It is also contemplated to utilize the clustered contact attachment methods described herein in a variety of MEMS devices, including, but not limited to, MEMS inertial measurement units, gyroscopes, pressure sensors, temperature sensors, resonators, air flow sensors, and accelerometers.

While the invention has been described in terms of various specific embodiments, those skilled in the art will recognize that the invention can be practiced with modification within the spirit and scope of the claims.

What is claimed is:

1. A method for providing a bond between a die and a housing, a micro-electromechanical system (MEMS) device formed on the die, said method comprising:
   depositing a plurality of clusters of contact material onto a bottom surface of the housing;
   placing the die onto the clusters; and
   subjecting the housing, the clustered contacts, and the die to a thermocompression bonding process.

2. A method according to claim 1 wherein depositing a plurality of clusters of contact material comprises depositing cluster of contacts which include two or more contacts per cluster.

3. A method according to claim 1 wherein depositing a plurality of clusters of contact material comprises depositing individual contacts within the clusters, the individual contacts having a diameter of about 2 mil.

4. A method according to claim 1 wherein depositing a plurality of clusters of contact material comprises depositing individual gold contacts within the clusters.

5. A method according to claim 1 wherein depositing a plurality of clusters of contact material comprises depositing nine clusters of contact material, each cluster having four individual contacts, onto a bottom surface of the housing.

6. A micro-electromechanical system (MEMS) device comprising:
   a micro-machine formed on a die;
   a housing configured to hold said micro-machine, said housing comprising a bottom surface; and
   a plurality of contact clusters on said bottom surface of said housing, each cluster comprising a plurality of individual contacts, said plurality of individual contacts utilized to bond said die to said housing through a thermocompression process.

7. A MEMS device according to claim 6 wherein each said cluster comprises at least two individual contacts.

8. A MEMS device according to claim 6 wherein each said individual contact is about two mil in diameter.

9. A MEMS device according to claim 6 wherein said plurality of contact clusters comprise individual contact made of gold.

10. A MEMS device according to claim 6 comprising nine said contact clusters, each said cluster comprising four said individual contacts made from gold.

11. A MEMS device according to claim 6 wherein said MEMS device is one of a gyroscope, an accelerometer, an inertial measurement unit, a pressure sensor, a resonator, an air flow sensor, and a temperature sensor.

12. A MEMS device according to claim 6 wherein said housing comprises one of metal, plastic, silicon, glass, or a ceramic material.

13. A micro-electromechanical system (MEMS) gyroscope comprising:
   a housing;
   a die;
   a micro-machine formed on said die, at least a portion of said micro-machine comprising at least one sense plate, at least one proof mass suspended above said at least one sense plate, at least one motor drive comb and at least one motor pick-off comb; and
   a plurality of contact clusters between said die and said housing, each cluster comprising a plurality of individual contacts, said plurality of individual contacts utilized to bond said die to said housing through a thermocompression process.

14. A MEMS gyroscope according to claim 13 wherein said plurality of contact clusters comprises at least two said individual contacts per cluster.

15. A MEMS gyroscope according to claim 13 wherein said individual contacts are about two mil in diameter.

16. A MEMS gyroscope according to claim 13 wherein said individual contacts are made from gold.

17. A method for forming a thermocompression bond between a die and a housing, the die having a micro-electromechanical system (MEMS) machine formed thereon, said method comprising:
   depositing a plurality of clusters of contact material between the die and the housing; and
   forming the bond between the die and the housing.

18. A method for bonding a die and a housing comprising:
   depositing a plurality of clusters of contact material between the die and the housing; and
   attaching the die and the housing through thermocompression bonding of the clusters of contact material.

19. A micro-electromechanical system (MEMS) accelerometer comprising:
   a housing;
   a die;
   a micro-machine fanned on said die, at least a portion of said micro-machine comprising at least one sense plate, at least one proof mass suspended above said at least one sense plate, at least one motor drive comb and at least one motor pick-off comb; and
   a plurality of contact clusters between said die and said housing, each cluster comprising a plurality of individual contacts, said plurality of individual contacts utilized to bond said die to said housing through a thermocompression process.

20. A MEMS accelerometer according to claim 19 wherein said plurality of contact clusters comprises at least two said individual contacts per cluster.

* * * * *